(12) United States Patent
Noeske

(10) Patent No.: US 7,512,208 B2
(45) Date of Patent: Mar. 31, 2009

(54) DIGITAL CLOCK DIVIDER

(75) Inventor: Carsten Noeske, Sexau (DE)

(73) Assignee: MICRONAS GmbH, Freiburg (DE)

( * ) Notice: Subject to any disclaimer, the term of this patent is extended or adjusted under 35 U.S.C. 154(b) by 37 days.

(21) Appl. No.: 11/891,300

(22) Filed: Aug. 9, 2007

(65) Prior Publication Data

US 2008/0040627 A1 Feb. 14, 2008

(30) Foreign Application Priority Data

Aug. 9, 2006 (DE) .................... 10 2006 037 436

(51) Int. Cl.
*H03K 21/00* (2006.01)
(52) U.S. Cl. .......................... 377/47; 377/48
(58) Field of Classification Search .............. None
See application file for complete search history.

(56) References Cited

U.S. PATENT DOCUMENTS

| | | | |
|---|---|---|---|
| 6,795,519 B2 * | 9/2004 | Chakravarthy | 377/48 |
| 7,209,534 B2 * | 4/2007 | Lewis | 377/47 |
| 2003/0025565 A1 * | 2/2003 | Takeda et al. | 331/100 |
| 2003/0222723 A1 * | 12/2003 | Kawahara | 331/57 |
| 2004/0258193 A1 * | 12/2004 | Mukaide | 377/47 |
| 2007/0222527 A1 * | 9/2007 | Pretl | 331/34 |
| 2008/0094144 A1 * | 4/2008 | Mar | 331/8 |

FOREIGN PATENT DOCUMENTS

| DE | 101 01 836 A1 | 7/2002 |
|---|---|---|
| EP | 1 304 804 A2 | 4/2003 |

* cited by examiner

*Primary Examiner*—Tuan T Lam
(74) *Attorney, Agent, or Firm*—Maginot, Moore & Beck

(57) ABSTRACT

A digital clock divider includes an adder and a clock division device configured to receive a first clock signal with a first frequency and to output a second clock signal having a lower frequency relative to the first frequency. The digital clock divider also includes a division value separation device and a feedback section. The division value separation device is configured to divide an addition value output from the adder into an integer value and a fractional value. The feedback section is configured to provide to the adder a feedback value, the feedback value comprising the fractional component or the fractional component modified by a processing device. The adder is configured to add the feedback value to an applied division value. The clock division device is controlled on the basis of the integer value.

17 Claims, 2 Drawing Sheets

DIGITAL CLOCK DIVIDER

FIELD OF THE INVENTION

The invention relates to a digital clock divider and to a method for operating a digital clock divider.

BACKGROUND

In modern SoC systems (SoC: System on Chip), asynchronous clock signals are provided with a digital clock divider. In such cases, a first clock signal with a relatively high frequency is applied to the digital clock divider, and a second clock signal with a lower frequency relative to the first frequency is generated from the first high frequency and output by the clock divider by means of an applied control signal. The frequency will in this case vary from one interval to another, depending on the divider factor, which is applied by means of the control signal. Normally, the resulting jitter is in the range of allowable jitter for digital interfaces.

Clock dividers normally use a so called digitally controlled oscillator (DCO). In such an arrangement, each input clock triggers an addition in an accumulator using a defined offset. The accumulator allows an overflow, so that the most significant bit (MSB/Most Significant Bit) represents a clock signal with a lower rate, which is proportional to the offset.

A disadvantage of such an arrangement is that an addition must take place at a very high input rate, which results in a high current consumption of the clock divider. An additional disadvantage is that the programmable output frequencies are uniformly distributed throughout the range between zero and the input frequency. As a consequence, a large bit width of the accumulator is required to achieve an adequate frequency resolution. The large bit width of the accumulator also has a detrimental influence on current consumption.

Moreover, yet another disadvantage is that the jitter is comparable to that of a first order noise shaper (Noise Shaper), whereby low frequency disturbance lines can occur in the spectrum of the output clock signal. Such disturbance lines can lead to problems with the recovery of the clock signal, which has to be provided without a jitter. Alternatively, such disturbance lines can lead to whistling sounds in the case of an application in the audio area.

SUMMARY

An object of at least some embodiments of the invention is to improve a digital clock divider and a method for operating a digital clock divider. A particular objective is to achieve a reduced current consumption. Preferably, it should be also possible to reduce jitter, or to make it possible to improve spectral shaping of a momentary error of the ideal jitter-free clock signal.

This object is achieved with the digital clock divider having the characteristics according to at least some embodiments of the invention.

In a first embodiment, a digital clock divider is provided with an adder and a clock division device, to which a first clock signal with a higher first frequency is applied, and which generates a second clock signal with a second frequency that is lower relative to the first frequency, wherein a division value separation device is constructed to divide an addition value output from the adder into an integer value and a fractional component. A feedback section then feeds back the fractional component which is supplied back for a later addition to the adder, so that the adder adds the back supplied fractional component, or a fractional component modified by a processing device, to an applied division value, and the clock division device is controlled on the basis of the integer value.

At least the adder and the division value separation device are preferably clocked by means of the second clock signal, which is to say with a clock signal that has a lower clock rate than that of the first clock signal.

In the feedback section is preferably connected a delay device, which is used to feed back the processed, and in particular delayed, fractional component. This delay device can contain a filter having a transfer function such that the clock divider generates in average the correct frequency.

The transfer function $H(z)$ can be preferably implemented by means of several feedback sections to provide different strongly delayed feedback of the fractional component to the adder.

In the feedback section or in the multiple feedback sections are preferably connected multipliers, dividers, inverters and shifters to enable weighting of the back supplied fractional component. This makes it possible to create in an advantageous manner noise shapers of a higher order, which can be used with suitable weighting factors for the spectral shaping of the jitter.

A division value storage device is preferably used in the arrangement, which supplies the applied division value to the adder.

An intermediate storage device, preferably connected between the division value separation device and the clock division device, performs intermediate storage of the integer value.

The clock division device counts up according to an embodiment form the integer value in a non-binary counting system.

The clock counting device preferably counts the integer value with a chain counter.

Between the division value separation device and the clock division device is preferably connected a recoder block, which converts the integer value into a representation that is processed by the clock division device that counts using the not-binary count system. The term "not-binary" counting system means a binary counting system in which the sequence of the numbers is transposed.

Between the division value separation device and the clock division device can be also connected a recoder block, which transfers the integer value into a representation that is used to control the clock division device implemented as a chain counter (in German: a counter with a feedback shift register). In the case that the clock division device is realized in the form of a so called chain counter, a so called chain counter recoding block (in German: start evaluation block for a counter which is provided with a feedback shift register) can be preferably connected between the division value separation device and the clock division device. This block converts the control information that is coded in the binary count system to the residual class polynomial representation that is required in the chain counter.

The functional operation of a chain counter is as follows:

"A chain counter is a counter that is based on a feedback shift register. A suitable feedback or feedback polynomes are selected, which generate a so called maximal sequence (MLS=Maximum Length Sequence), that is to say that all numbers that can be represented by the bit number of the shift register are passed through. Since the numbers cannot pass through in the normal sequence in a chain counter, counters with a programmable count value require a chain counter recoding block. This is a block that calculates the start value or end value based on the count value. Two embodiments are possible: 1) Testing is based on a fixed end value and the recoding block is used to generate the start value, from which n cycles are required until the end value is reached; or 2) The operation is always started with the same value and the end value is calculated, at which point the counting of the counter is finished. According to an advantageous embodiment, the chain counter recoding block is a table in which an input value is associated with an output value.

Preferred is an autonomous method for operating a digital clock divider, in particular for operating such a digital clock divider, wherein a fractional component is added up to a division value according to the method so that the fractional component is separated in a cyclical sequence of the addition value from the addition and fed back for the following addition, and so that an integer value of the addition is input as a divider factor or a basis for a divider factor of a clock division device in order to supply a second clock having a lower frequency from the first clock signal which has the higher frequency.

The divider factor is preferably generated and supplied on the basis of the second clock signal. The fractional component of the addition value is preferably delayed variably strong and fed back through various feedback sections. The fractional component or components which are fed back can be weighted.

The invention therefore relates to a digital clock divider, which calculates an integer divider factor and which is clocked on the basis of the lower output rate, wherein the integer divider factor varies. A simple clock division device, to which a clock signal with a high input rate is supplied, is controlled at the low output rate with this divider factor in the form of an integer value. Such a temporary integer divider factor is preferably generated by means of a noise shaper, wherein a noise shaper of higher order can also be used to make shaping of the jitter possible as required. Also advantageous is recoding of the integer value, which forms such a divider factor, for a decimation counter, for example in the form of a so called chain counter, used to further simplify the clock division device at the high rate.

Because an accumulation is thus performed at the output rate, significant savings can be achieved with respect to the power consumption of the adder relating to the decimation factor between the input rate and the output rate of the clock signal. The bits of the accumulator having the highest significance are thus used in a simple manner for control of either directly the clock division device, or the interconnected intermediate storage device or the chain counter recoding block.

The embodiment of the feedback of the fractional component of the accumulator in the form of a filter at a higher order enables an advantageous spectral shaping of the jitter. In particular, discrete lines, which can lead to whistling noise, can be prevented with a suitable selection of the transmission function of such a noise shaper, when the output clock signal is used for the digital/analog conversion, in particular in the audio sphere.

The features and advantages of embodiments of the invention, as well as others, will become more readily apparent to those of ordinary skill in the art by reference to the following detailed description and accompanying drawings.

DETAILED DESCRIPTION

Figure 1:
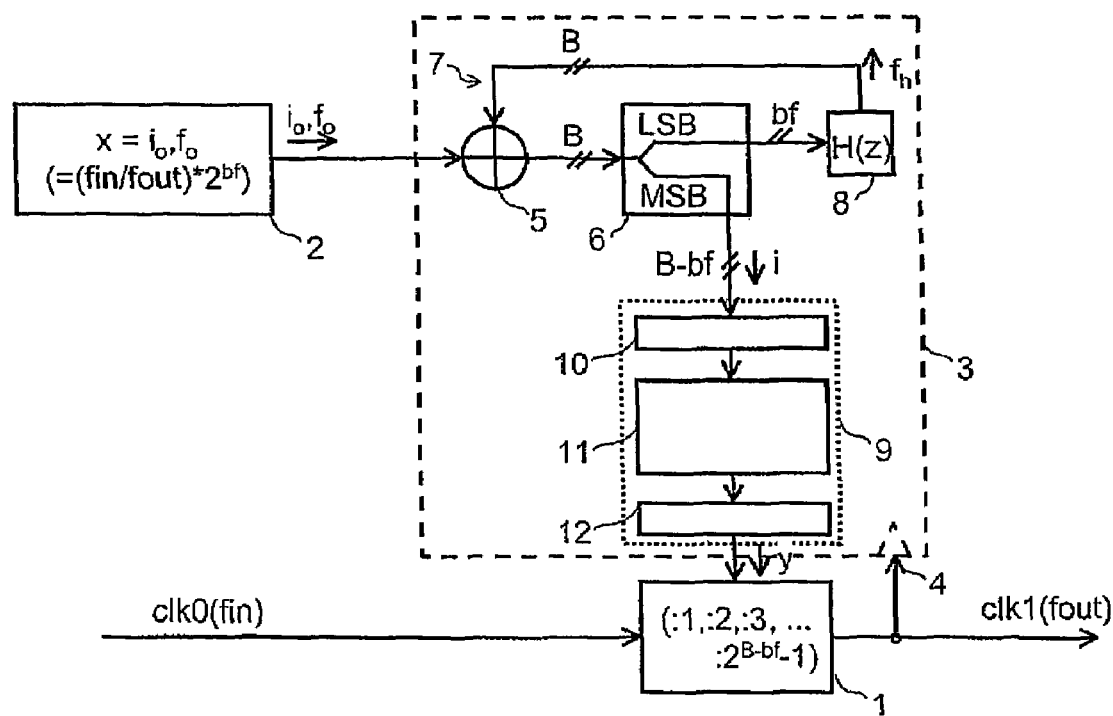
FIG. 1 shows a general schematic representation of an exemplary embodiment of a digital clock divider.

The basic principles will now be explained based on the exemplary embodiment shown in FIG. 2, while FIG. 1 shows a corresponding embodiment having examples of count values.

Figure 2:
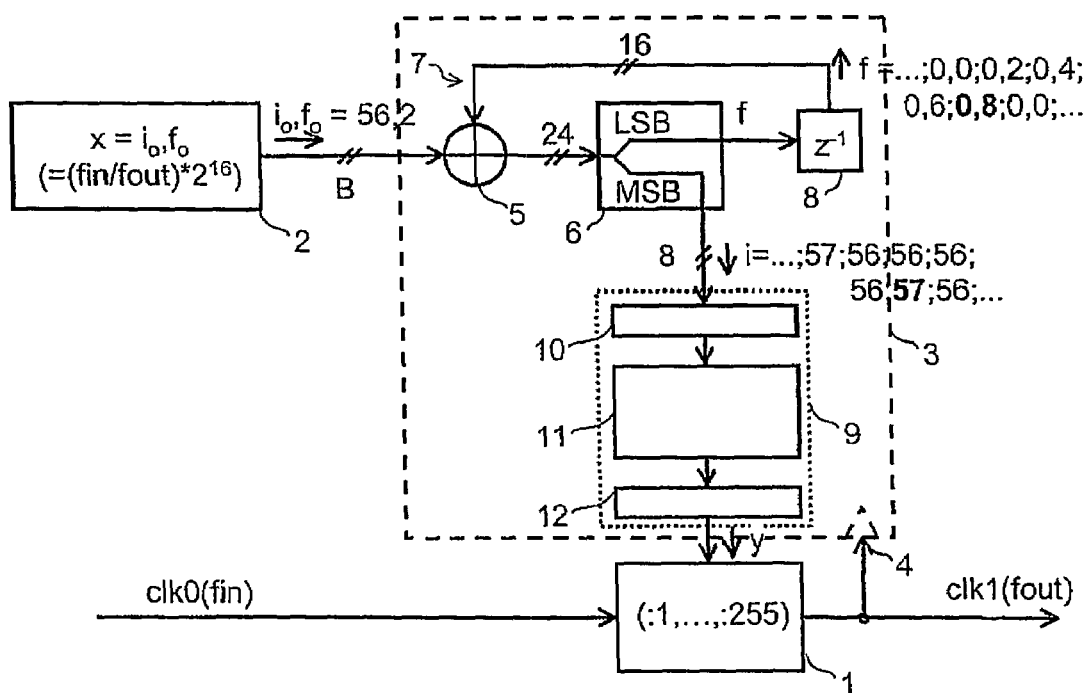
FIG. 2 shows a schematic representation of the circuit components in a first embodiment of an exemplary digital clock divider.

FIGS. 1 and 2 show an example of a digital clock divider provided with a clock division device 1, wherein a first clock signal clk0 is input at its input with a first frequency fin. Based on the control value or control signal, which is input to the clock division device 1 as a divider factor y, and the first clock signal clk0, a second clock signal clk1 is provided with a second frequency fout that is lower relative to the first frequency fin.

A division value x is provided for example from a division value storage device 2, which indicates the desired relationship of the clock rates or of the frequency rates between the first frequency fin and the second frequency fout. Such a division value x can be in this case represented by an integer component io contained therein, and by a fractional component fo contained therein in the form of corresponding numerals in front of or after the decimal point or comma.

The corresponding division point x is output through a parallel line arrangement, in particular a bus, such as shown in FIG. 1 as the bus which has lines B, such as shown in FIG. 2 or using lines as indicated in FIG. 2 by means of lines 24. By way of example, the first eight lines should in this case carry bits for the integer value i contained in the division value x, and the 16 remaining lines carry bits for the fractional component fo contained in the division value x. As an alternative, for example, a serial transmission can be also realized, so that for example a bit sequence would be transmitted with 24 bits, out of which for example the 16 least significant bits (LSB/Lease Significant Bits) are used for the representation of the fractional component fo contained in the division value x, and the eight most significant bits (MSB/Most Significant Bits) represent the integer value.

The division value x, for example the number 56.2 shown in FIG. 2, is input to a divider factor generation device 3, which supplies the divider factor y. The generation of the divider factor y is performed on the basis of the input division value x, and also of the second clock signal clk1 having a second, lower frequency fout, which is input to the divider factor generation device 3 at a clock input 4.

The division value x is input in the division factor generation device 3 to an adder 5. One addition value of the adder 5 is input to a division value separation device 6, which performs a splitting or a division into a separate fractional component f and a separate integer value i of the input value. In the case when a bus is employed which has for example B lines (FIG. 1) or 24 lines (FIG. 2), the bf lines (FIG. 1) or 16 lines (FIG. 2), which carry the value of the component input after the decimal point, will be separated into the B−bf lines (FIG. 1) or 8 lines (FIG. 2), which carry the input value of the integer value i or of the component before the decimal point. In the case of a serial value input, the most significant bits MSB, which represent the integer value i, are separated from the least significant bit LSB, which carry the value of the fractional component f.

The fractional component f, or in particular, preferably its magnitude value, is input to a feedback section 7, which is equipped with another processing device 8, such as for example a delay device, which delays each input fractional component f, in particular by one cycle, and supplies it to a second input of the adder 5. The fractional component is a positive number so that the output of the delay device is represented by a fractional value $f_n$ having a full width of the adder word with zeros in the front portion.

The adder 5 thus adds each input division value x and the fractional component f which was separated in the previous cycle from the result of the addition. The clocking of the adder 5, of the division value separation device 6 and of the delay device is in this case performed by means of the second clock signal clk1 input at the clock input 4. The processing device 8 can contain a filter having a transfer function H(z) (FIG. 1) or $z^{-1}$ (FIG. 2). The relationship 1−H(z)=0 is applicable to z=1 in preferred embodiments, wherein the clock divider generates, on average, a correct frequency.

When, for example, one division value is input which equals 56.2, and an initial fractional component f which equals zero, 0 would be input to the adder 5 as the first addition value for the value 56.2 to the division value separation device 6. As a fractional component f, this component would then be supplied back for the next cycle with the value 0.2 to the adder 5, so that the next addition result at the second cycle creates the addition value 56.4. For the third cycle, a corresponding fractional component f is input to the adder with the value 0.4, a fractional component f is input for the fourth cycle with the value 0.6, for the fifth cycle is input a fractional component f with the value 0.8, and for the sixth cycle is again input the initial fractional component f with the value 0.0. An advantageous cyclical sequence is obtained in this manner of the values of the fractional component f, which are input to the adder 5 for the addition to the division value x. The integer value i output from the division value separation device 6 has in the described example an initial value that equals 56, which is maintained throughout a sequence of four cycles until the addition value 57 is achieved in the fifth cycle with the addition. In the fifth cycle, a corresponding integer value i with the value 57 is output. In the following cycle, the value 56 is again output as the integer value i. Therefore, the temporal sequence also exhibits a cyclical sequence of the integer value i.

The division value x can be determined based on an example in an advantageous manner as a power of 2 of the count bf (FIG. 1) or 16 (FIG. 2) of the locations or lines of the fraction component f to be separated. The integer value i can be input directly as a divider factor y of the clock division device 1 when it is it realized as a normal counter in the binary system. However, the integer value i is preferably temporarily stored and/or temporarily processed. For this purpose, the integer value i is input to a temporary storage device 9, which can be constructed for example as a simple register or latch.

Moreover, in the particularly preferred arrangement which is shown by way of example, this intermediate storage device 9 is designed with a more complex construction as it is equipped with, in sequence, an optional first register 10, a chain counter recoder block 11, and an optional second register 12, wherein the integral number i is input to this sequence. This block converts the coded control information that is set in the binary count system to the residual class polynomial representation required in the chain counter. This is necessary in the case when the division device 1 is constructed as a chain counter and the required recoding from a binary system to the polynomial residual class is not realized in the device itself. The second register 12 then provides the divider factor y for the clock division device 1. The clocking of the first register, of the chain counter recoder block 11, and of the second register 12 is preferably also realized with the second clock signal clk1 having the lower second frequency fout.

Figure 3:
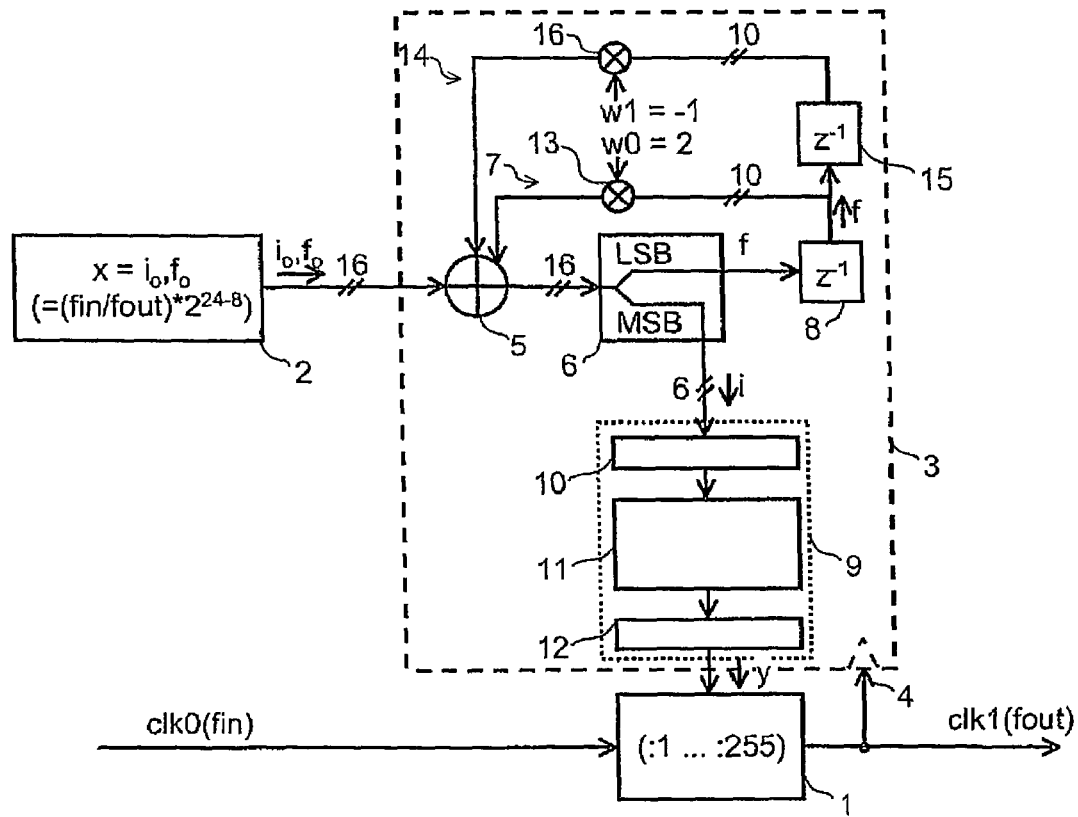
FIG. 3 shows another embodiment of such a digital clock divider having a noise shaper of a higher order.

FIG. 3 shows a particularly preferred embodiment form of a digital clock divider. Only components and aspects which are provided with a different construction and/or function relative to the corresponding components or procedural steps in the previous embodiments are described below.

By way of an example, the division value 1 is provided according to a second embodiment form with a value length and/or a value width of 16 bits, from which again, for example, the 6 most significant bits MSP are branched off as an integer value i in the division value separation device 6. The remaining 10 bits form the least significant bits LSB the fractional component f, which is fed back to the feedback section 7. In principle, however, any other counts of bits can be selected for the representation of the division value x and/or for splitting into components for the fractional component f and the integer value i.

As a special characteristic, a multiplier 13 is inserted in the feedback section 7 as an additional component used for weighting the fractional component f, which is momentarily input from the processing device 8, with a weighting factor w0. For example, the weighting factor w0 is shown to have a value 2, and thus the multiplier can be realized as a simple shift device (shifter in English) with fixed shifting.

Another difference compared to the embodiment forms according to FIG. 1 or 2 is that the embodiment illustrated in FIG. 3 is provided with a second feedback section 14 in addition to or as an alternative to the multiplier 13. The second feedback section 14 includes a second processing device 15, for example having the form of a delay device, used to delay a fractional component f obtained from the first processing device, which is again provided for example in the form of a delay device, by another cycle, before this component is input, thus delayed by two cycles, as another value to be added at the adder 5. The second feedback section 14 is preferably also equipped with a multiplier 16, which multiplies the twice delayed fractional component with another, second weighting factor w1. By way of an example, the second weighting factor w1 is shown to be a negative value −1, so that the twice delayed value will not be added by the adder 3, but instead it will be subtracted.

As one can see in particular from this embodiment, the adder 5 can be employed also as a subtraction member with the input of a corresponding negative value. In principle, instead of a continuous addition, a continuous subtraction of the fractional component f from the division value x is also another possible alternative embodiment. However, as one can clearly see from this embodiment, the adder 5 can be employed also in this case for the implementation of the transfer function H(z).

What is claimed is:

1. A digital clock divider, comprising
an adder,
a clock division device configured to receive a first clock signal with a first frequency, and to output a second clock signal having a lower frequency relative to the first frequency,
a division value separation device configured to divide an addition value output from the adder into an integer value and a fractional component,
a feedback section configured to provide a feedback value to the adder, the feedback value comprising the fractional component or the fractional component modified by a processing device,
wherein the adder is configured to add the feedback value to an applied division value and wherein the clock division device is controlled on the basis of the integer value.

2. The digital clock divider according to claim 1, wherein at least the adder and the division value separation device are configured to be clocked by the second clock signal.

3. The digital clock divider according to claim 1, wherein in the feedback section includes the processing circuit, the processing circuit configured to delay or process the fractional component.

4. The digital clock divider according to claim 1, further comprising at least one additional feedback section configured to provide to the adder an additional feedback value having a delay that is different than a delay of the feedback value.

5. The digital clock divider according to claim 1, wherein in the feedback section includes multipliers, dividers, inverters or shifters for weighting of the fractional component.

6. The digital clock divider according to claim 1, further comprising a division value storage device configured to supply the adder with the applied division value.

7. The digital clock divider according to claim 1, wherein the first and second clock signals operate in a cycle, and wherein the integer value constitutes a value in a first cycle position that is decreased or increased with a fixed amount relative to a value of another cycle position of the cycle.

8. The digital clock divider according to claim 1, further comprising a temporary storage device operably coupled between the division value separation device and the clock division device to perform temporary storage of the integer value.

9. The digital clock divider according to claim 1, wherein the clock division device is configured to count the integer value in not-binary count system.

10. The digital clock divider according to claim 9, further comprising a recoder block connected between the division value separation device and the clock division device, which is configured to convert the integer value into a representation, which is processed by the clock division device that counts in a not-binary count system.

11. The digital clock divider according to claim 1, wherein the clock division device is configured to count the integer value with a chain counter.

12. The digital clock divider according to claim 11, further comprising a recoder block connected between the division value separation device and the clock division device, which is configured to convert the integer value into a representation which controls the clock division device as a chain counter.

13. A method for operating a digital clock divider that includes an adder and a clock division device, the clock division device configured to receive a first clock signal with a first frequency, and to output a second clock signal having a lower frequency relative to the first frequency, comprising:
  adding a fractional component to a division value using the adder to generate an addition value, wherein the fractional component is based on a value separated from a prior addition value generated by the adder,
  separating the addition value in to an integer value and a further fractional component
  inputting the integer value as a divider factor or as a basis for generating a divider factor of the clock division device in order to provide the second clock signal having the lower frequency than the first clock signal.

14. The method according to claim 13, wherein the divider factor is generated and supplied on the basis of the second clock signal.

15. The method according to claim 13, further comprising providing the further fractional component to the adder via at least a first feedback section delayed by a first amount.

16. The method according to claim 14, further comprising providing the further fractional component to the adder via at least a second feedback section delayed by a second amount.

17. The method according to claim 13, further comprising providing the further fractional component to the adder via at least a first feedback section weighted a first weighting value.

* * * * *